(12) United States Patent
Martens et al.

(10) Patent No.: US 8,319,157 B2
(45) Date of Patent: Nov. 27, 2012

(54) LITHOGRAPHIC APPARATUS AND DEVICE MANUFACTURING METHOD

(75) Inventors: Arjan Hubrecht Josef Anna Martens, Valkenburg (NL); Pieter Jacob Kramer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 219 days.

(21) Appl. No.: 12/843,614

(22) Filed: Jul. 26, 2010

(65) Prior Publication Data

US 2011/0017724 A1    Jan. 27, 2011

Related U.S. Application Data

(60) Provisional application No. 61/228,765, filed on Jul. 27, 2009, provisional application No. 61/258,326, filed on Nov. 5, 2009.

(51) Int. Cl.
*H05B 1/02*        (2006.01)
(52) U.S. Cl. ............... 219/494; 347/147; 347/E13.001; 347/E15.001; 702/99
(58) Field of Classification Search .............. 219/494; 702/99; 374/147, E13.001, E15.001
See application file for complete search history.

(56) References Cited

U.S. PATENT DOCUMENTS

| | | | |
|---|---|---|---|
| 4,509,852 A | 4/1985 | Tabarelli et al. | 355/30 |
| 7,352,437 B2 | 4/2008 | Nomoto | |
| 2003/0118074 A1* | 6/2003 | Seki et al. | 374/29 |
| 2004/0031756 A1* | 2/2004 | Suzuki et al. | 210/646 |
| 2004/0136494 A1 | 7/2004 | Lof et al. | 378/34 |
| 2004/0207824 A1 | 10/2004 | Lof et al. | 355/30 |
| 2006/0038968 A1 | 2/2006 | Kemper et al. | 355/18 |
| 2006/0119809 A1 | 6/2006 | Verhagen et al. | 355/30 |
| 2006/0158627 A1 | 7/2006 | Kemper et al. | 355/53 |
| 2008/0212046 A1 | 9/2008 | Riepen et al. | 355/30 |
| 2009/0021709 A1 | 1/2009 | Nagasaka | |
| 2009/0174101 A1* | 7/2009 | Johnson | 264/40.1 |
| 2010/0045951 A1 | 2/2010 | Martens et al. | 355/30 |
| 2010/0060868 A1 | 3/2010 | Tanasa et al. | 355/30 |
| 2010/0163221 A1* | 7/2010 | Ruijl et al. | 165/247 |

FOREIGN PATENT DOCUMENTS

| | | |
|---|---|---|
| EP | 1 420 300 | 5/2004 |
| JP | 11-051481 | 2/1999 |
| JP | 2001-050589 | 2/2001 |
| JP | 2001-141303 | 5/2001 |
| JP | 2005-009733 | 1/2005 |
| JP | 2006-190971 | 7/2006 |
| JP | 2006-222165 | 8/2006 |
| WO | WO 99/49504 | 9/1999 |
| WO | WO 2005/064405 | 7/2005 |

OTHER PUBLICATIONS

Korean Office Action dated Aug. 31, 2011 in corresponding Korean Patent Application No. 10-2010-0072102.
Japanese Office Action mailed Feb. 14, 2012 in corresponding Japanese Patent Application No. 2010-166761.

* cited by examiner

*Primary Examiner* — Hoai V Ho
(74) *Attorney, Agent, or Firm* — Pillsbury Winthrop Shaw Pittman LLP

(57) ABSTRACT

Fluid temperature control and sensor calibration is disclosed. In an embodiment, a fluid temperature control unit includes a heater configured to heat a first fluid in a first fluid path, a first temperature sensor configured to measure a temperature of the first fluid in the first fluid path, a second temperature sensor configured to measure a temperature of a second fluid in a second fluid path, and a controller configured to control the heater on the basis of the temperature sensed by the first sensor and the temperature sensed by the second sensor.

24 Claims, 5 Drawing Sheets

LITHOGRAPHIC APPARATUS AND DEVICE MANUFACTURING METHOD

This application claims priority and benefit under 35 U.S.C. §119(e) to U.S. Provisional Patent Application Ser. No. 61/228,765, entitled "Lithographic Apparatus and Device Manufacturing Method", filed on Jul. 27, 2009, and to U.S. Provisional Patent Application Ser. No. 61/258,326, entitled "Lithographic Apparatus and Device Manufacturing Method", filed on Nov. 5, 2009. The contents of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the swap of the tables may take place, for example, under the projection system.

In an immersion apparatus, immersion liquid is handled by a fluid handling system or apparatus. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

SUMMARY

In an immersion lithographic apparatus it may be necessary to precisely control the temperature of one fluid relative to another fluid. For example, it may be necessary to control the temperature of immersion fluid being provided in the space between the final element of the projection system and a substrate with respect to the temperature of liquid being used thermally to condition the projection system, or vice versa. For this it may be necessary to compare the temperature of the first fluid to that of the second fluid. If temperature sensors are being used for this purpose it may be necessary to calibrate those temperature sensors relative to one another, often to an accuracy of less than 1 mK.

It is desirable, for example, to provide a fluid temperature control unit to adjust the temperature of a first fluid based on the temperature of a second fluid and/or to provide a temperature sensor calibration unit which can calibrate a first temperature sensor configured to measure the temperature of a first fluid in a first fluid path relative to a second temperature sensor.

According to an aspect, there is provided a fluid temperature control unit comprising: a heater configured to heat a first fluid in a first fluid path; a first temperature sensor configured to measure a temperature of the first fluid in the first fluid path; a second temperature sensor configured to measure a temperature of a second fluid in a second fluid path; and a controller configured to control the heater on the basis of the temperature sensed by the first sensor and the temperature sensed by the second sensor.

According to an aspect, there is provided a temperature sensor calibration unit comprising: a first temperature sensor configured to measure a temperature of a first fluid in a first fluid path; a second temperature sensor in a conduit portion; a valve configured to selectively switch flow of first fluid from the first fluid path to the conduit portion or flow of a second fluid from a second fluid path to the conduit portion; and a calculation unit configured to calculate a calibration temperature error in the second temperature sensor relative to the first temperature sensor, or vice versa, when the valve has switched flow of first fluid from the first fluid path to the conduit portion.

According to an aspect, there is provided a fluid temperature measurement unit comprising: a first temperature sensor configured to measure a temperature of a first fluid in a first fluid path; a second temperature sensor configured to measure a temperature of the first fluid in a by-pass loop of the first fluid path; and a heat exchanger in the by-pass loop upstream of the second temperature sensor to exchange heat between first fluid in the by-pass loop and a second fluid.

According to an aspect, there is provided a method of controlling a temperature of a fluid at a fluid outlet of a first fluid path, the method comprising: measuring the temperature of a first fluid in the first fluid path downstream of a heater in the first fluid path; measuring a temperature of a second fluid in a second fluid path; and controlling the heater on the basis of the temperature of the first fluid and the second fluid so that the heater heats the first fluid to bring its temperature closer to that of the second fluid.

According to an aspect, there is provided a method of sensor calibration, the method comprising: measuring a temperature of a first fluid in a first fluid path using a first temperature sensor; measuring a temperature of fluid in a conduit portion using a second temperature sensor; switching flow of first fluid from the first fluid path to the conduit portion; and calculating a calibration temperature error in the second temperature sensor relative to the first temperature sensor, or vice versa, on the basis of signals from the first and second temperature sensors.

According to an aspect, there is provided a method of measuring a temperature in a second fluid, the method comprising: placing a temperature sensor in a by-pass loop of a first fluid path; and providing a heat exchanger in the by-pass loop upstream of the temperature sensor for exchanging heat between first fluid in the by-pass loop and the second fluid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
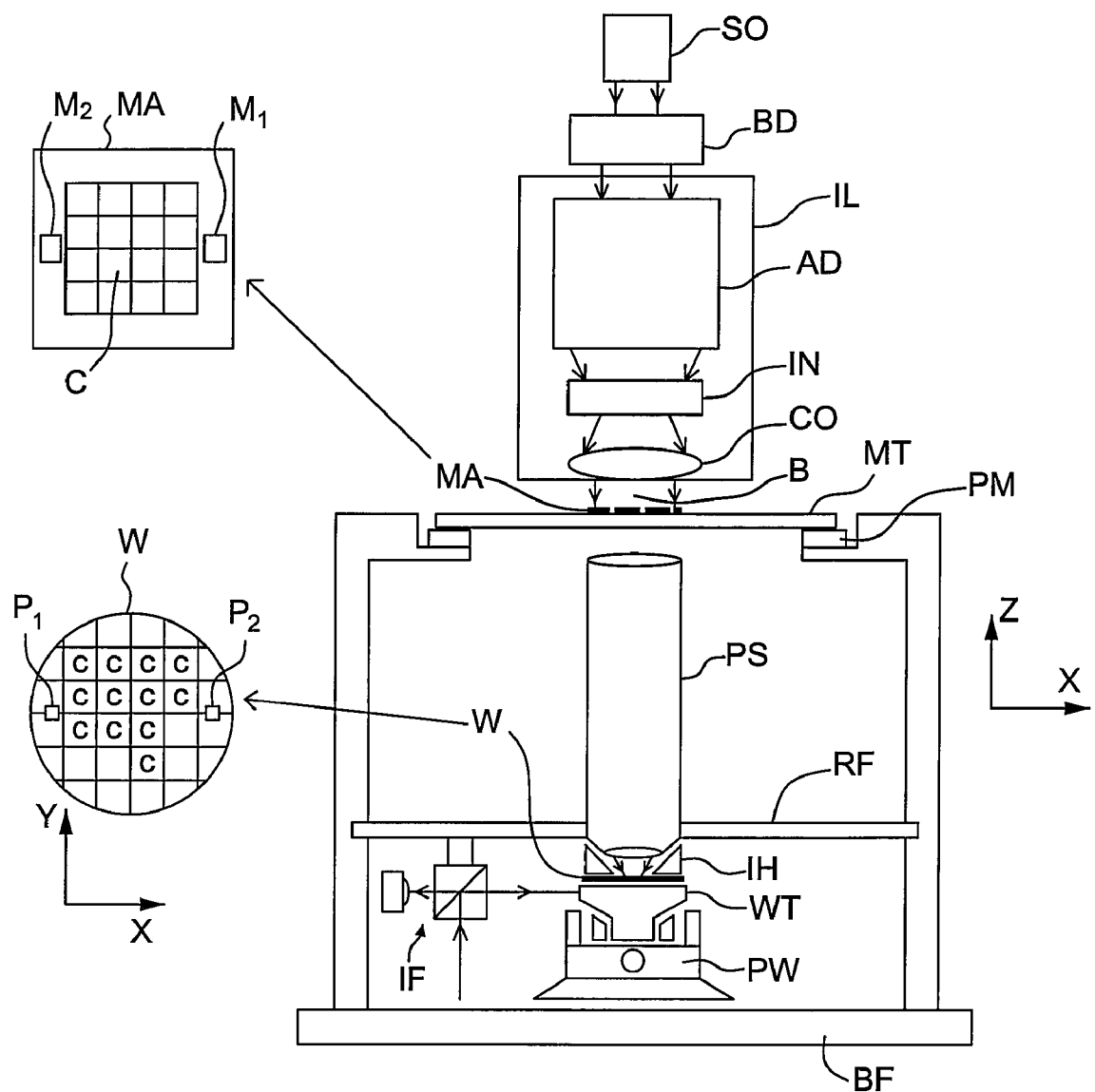
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains stationary relative to the projection system PS whilst the substrate W moves underneath that area. FIGS. 2-5 show different supply devices which can be used in such a system. Sealing features are present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 may be used in such a system. However, sealing features are not present, are not activated, are not as efficient as normal or are otherwise ineffective to seal liquid to only the localized area.

Figure 2:
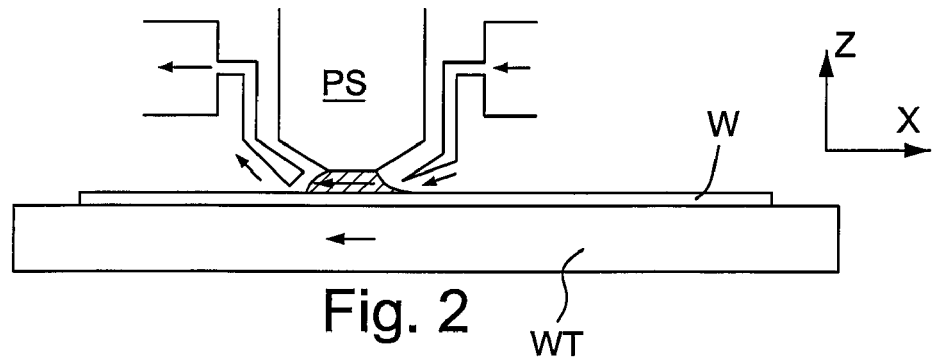
FIGS. 2 and 3 depict a liquid supply system for use in a lithographic projection apparatus.
Figure 3:
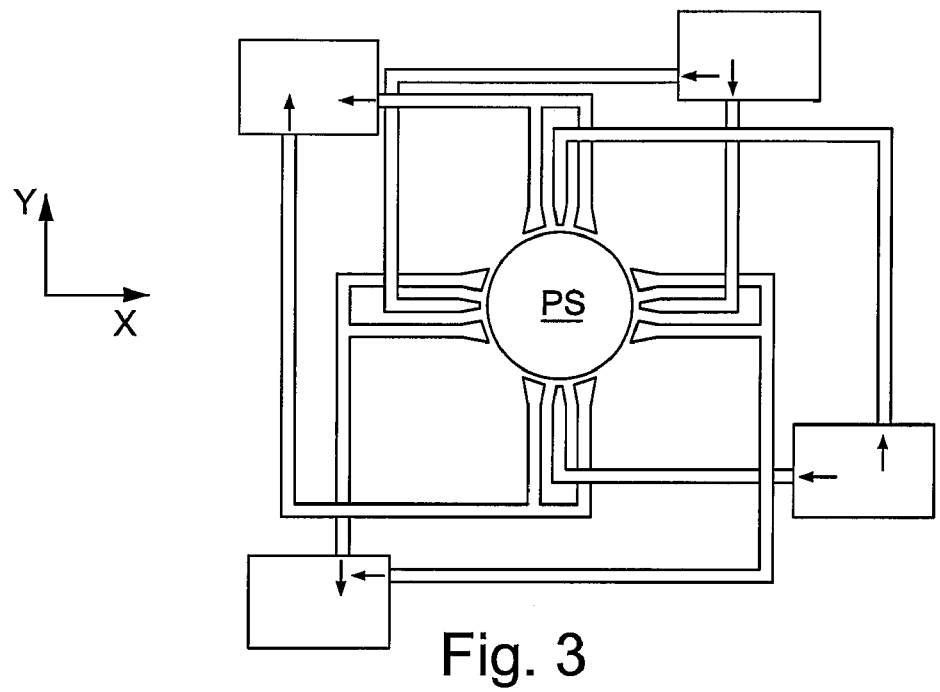

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
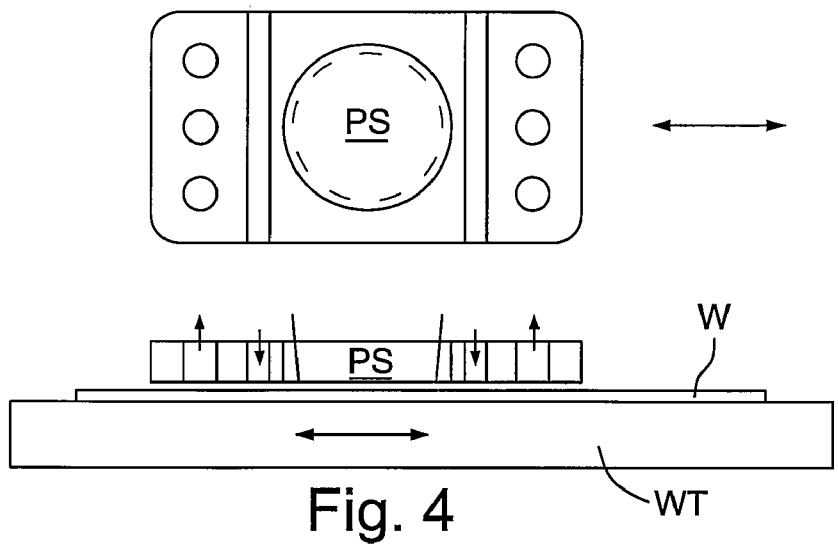
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with liquid confinement structure which extends along at least a part of a boundary of the space between the final element of the projection system and the substrate table. Such an arrangement is illustrated in FIG. 5.

Figure 5:
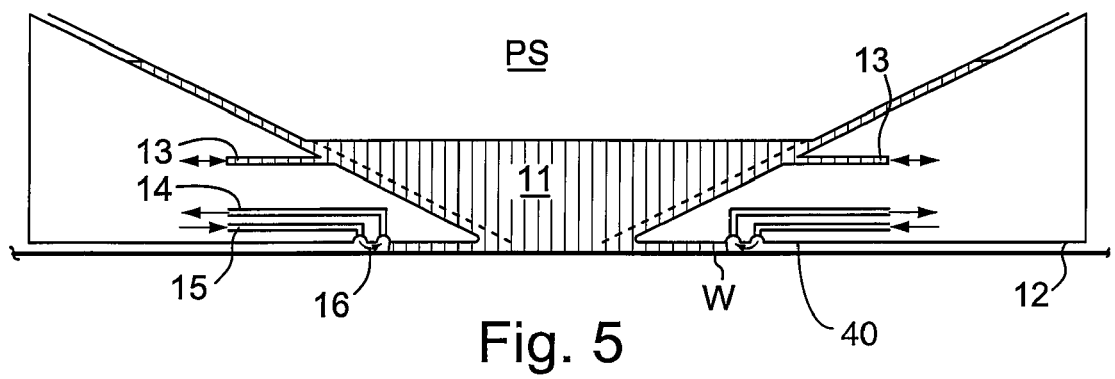
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may contained in the space 11 by the gas seal 16 which, during use, is formed between the bottom of the liquid confinement structure 12 and the surface of the substrate W.

The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Other types of liquid confinement structure to which an embodiment of the present invention may be applied include the so called gas drag liquid confinement structure such as that described in U.S. patent application No. 61/181,158 filed 25 May 2009, which is hereby incorporated by reference. U.S. patent application publication no. US 2008/0212046 provides further details and its content is also hereby incorporated by reference in its entirety.

The example of FIG. 5 is a so called localized area arrangement in which liquid is only provided to a localized area of the top surface of the substrate W at any one time. Other arrangements are possible. For example, an arrangement using a single phase extractor on the undersurface 40 of the liquid confinement structure 12 may be used. An extractor assembly comprising a single phase extractor with a porous member is described in United States patent application publication no. US 2006/0038968, incorporated herein in its entirety by reference. An arrangement in which such an extractor assembly is used in combination with a recess and a gas knife is disclosed in detail in United States patent application publication no. US 2006/0158627 incorporated herein in its entirety by reference. An embodiment of the invention may be applied to a fluid handling structure used in all wet immersion apparatus. In the all wet embodiment, fluid is allowed to cover the whole of the top surface of the substrate and all or part of the substrate table, for example, by allowing liquid to leak out of a confinement structure which confines liquid to between the final element of projection system and the substrate. An example of a fluid handling structure for an all wet embodiment can be found in United States patent application publication no. US 2010/0060868.

In all of the above liquid confinement structures, liquid is provided to a space 11 between the projection system PS and the substrate W and/or substrate table WT. In the example of FIG. 5 this is provided through outlet 13.

The refractive index of immersion liquid (for example ultra pure water) is highly sensitive to temperature. Therefore, it is desirable to accurately control the temperature of the fluid, e.g., liquid, provided to the space 11 (hereinafter referred to in the description as a first fluid).

In one embodiment the temperature of the first fluid is arranged to be substantially the same as that of thermal conditioning liquid provided to the projection system PS (hereinafter referred to as a second fluid). This may be advantageous because then there will be no thermal transfer between the fluid in the space 11 and the projection system PS.

Figure 6:
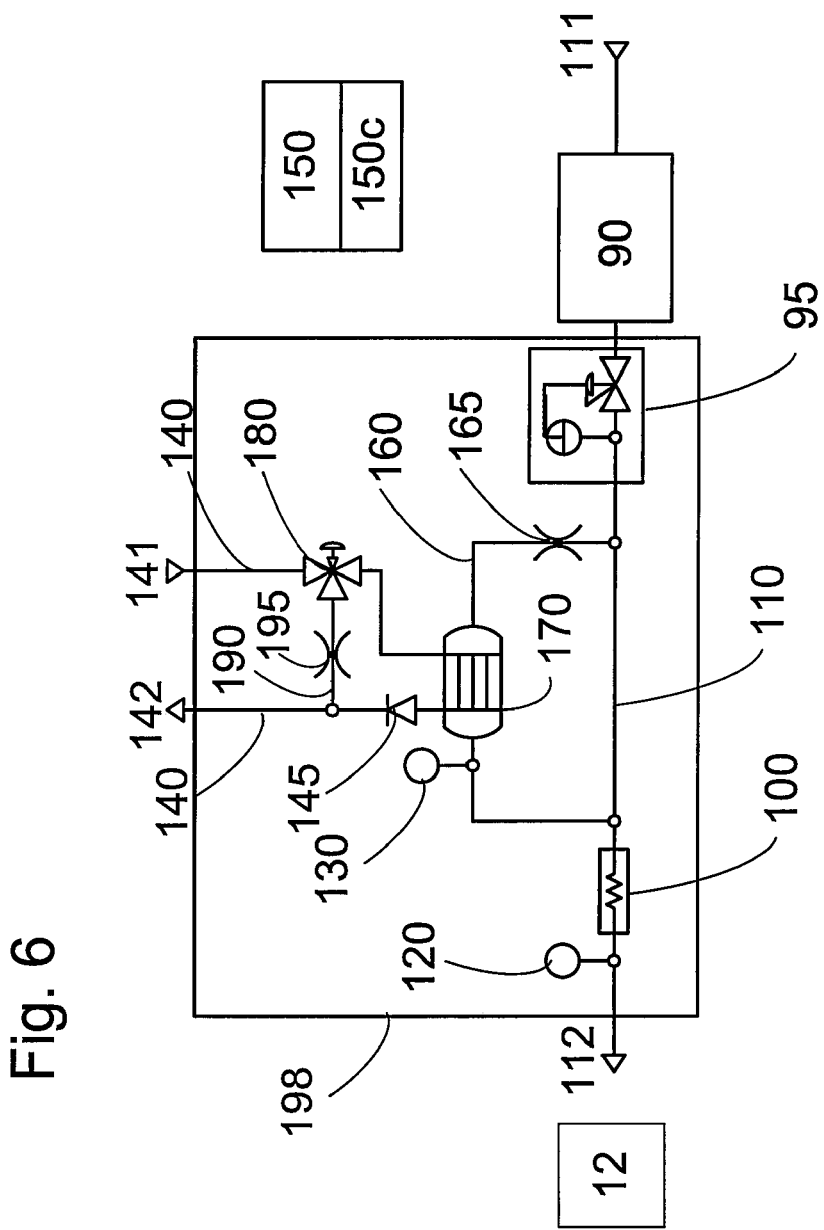
FIG. 6 depicts, schematically a fluid temperature control unit according to an embodiment.
Figure 7:
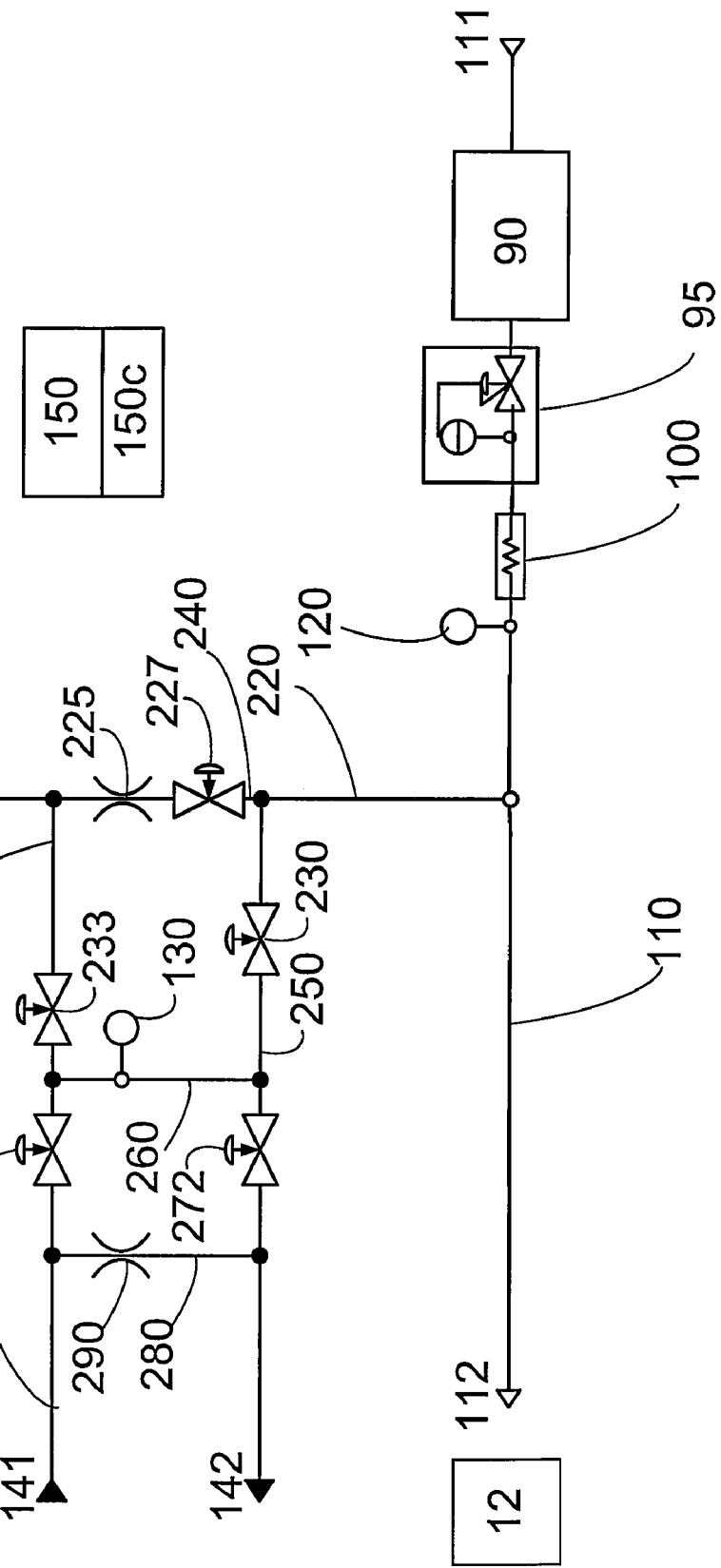
FIG. 7 depicts, schematically a fluid temperature control unit according to a further embodiment.

FIGS. 6 and 7 show schematically two embodiments of a fluid temperature control unit to achieving the matching of the temperatures of the first and second fluids. Both of the embodiments of FIGS. 6 and 7 rely on comparing signals from two temperature sensors. In order for the system to work the two temperature signals should be calibrated relative to one another to within less than 1 mK. U.S. patent application publication no. US 2010/0045951 discloses a method of controlling the temperature of a fluid which compensates for thermal disturbances between a control unit and the point of use. US 2010/0045951 discloses a way of calibrating two sensors which are placed in the same fluid path. This method can be applied wherever there is a large distance between the last control step and the point of use. An embodiment of the present invention is used to make final adjustments to the temperature of a fluid with reference to a different fluid. This present method can be used in combination with that described in US 2010/0045951.

One way of calibrating two sensors is to remove them from the apparatus and put them into the same environment. However, this results in downtime of the apparatus and thereby loss in throughput and so is undesirable. The embodiments of FIGS. 6 and 7 allow calibration to take place without removing the temperature sensors from the apparatus and thereby losing uptime of the apparatus. In some circumstances it is even possible to calibrate the two temperature sensors relative to one another during operation of the apparatus.

FIG. 6 illustrates schematically a fluid temperature control unit according to an embodiment. The fluid temperature control unit comprises a first fluid path 110 for flow of a first fluid therethrough. The first fluid path may start at a fluid source 111. The first fluid may be provided to an outlet 112 of the first fluid path 110. From the outlet 112, the first fluid may be provided to a component of the immersion apparatus. The component of the immersion apparatus may be the liquid confinement structure 12. The first fluid may then be provided into the space 11, for example.

A first temperature sensor 120 is provided in the first fluid path 110 to measure the temperature of the first fluid. The first temperature sensor 120 is provided at a downstream end of the first fluid path 110 adjacent the outlet 112.

A second temperature sensor 130 is provided to measure the temperature of a second fluid. The second fluid flows in a second fluid path 140. The second fluid path is from an inlet 141 to an outlet 142 and includes a one way valve 145.

The second temperature sensor 130 is in a first by-pass loop 160 of the first fluid path 110. That is, a portion of the fluid flow of first fluid in the first fluid path 110 is forced into the first by-pass loop 160 to by-pass a portion of the first fluid path 110. A flow restrictor 165 is provided in the first by-pass loop 160 to restrict the amount of first fluid flowing through the by-pass loop 160. A heat exchanger 170 is provided in the first by-pass loop 160. The heat exchanger 170 is upstream of the second temperature sensor 130.

The second fluid path 140 directs the second fluid to the heat exchanger 170. In the heat exchanger 170 the relative magnitudes of flow of first fluid and second fluid therethrough are such that the first fluid has its temperature changed to that of the second fluid. In order to achieve the change in temperature of the first fluid to the temperature of the second fluid, a flow of the second fluid should be at least three times, desirably at least six times the amount of the first fluid flow. So, by measuring the temperature of the first fluid passing out of the heat exchanger 170, the second temperature sensor 130 effectively measures the temperature of the second fluid.

A controller 150 is provided to control valves of the fluid temperature control unit as well as to control components of the fluid temperature control unit which are used to adjust the temperature of the first fluid. The controller 150 receives signals from the first and second temperature sensors 120, 130, compares the difference in temperature and adjusts parameters of the fluid temperature control unit so that the temperature of the first fluid as measured by the first temperature sensor is substantially equal (e.g. within 5 mK, 2 mK or 1 mK or less than 1 mK) of the temperature of the second fluid as measured by the second temperature sensor 130 (albeit indirectly).

In order to adjust the temperature of the first fluid, a coarse temperature controller 90 is provided at the upstream end of the first fluid path 110. A flow controller 95 is provided downstream of the coarse temperature controller. Finally, a heater 100 is provided downstream of the first by-pass loop 160 and upstream of the first temperature sensor 120.

The coarse temperature controller 90, under the control of controller 150, is adjusted so that the temperature of the first fluid is a little below that of the temperature of the second fluid as measured by the second temperature sensor 130. The coarse temperature controller 90 needs to supply a stable fluid temperature for the calibration to be effective. Temperature stability should be preferably be below 1 mk/30s. The power output of heater 100 is then adjusted to heat the first fluid to the temperature of the second fluid as measured by the second temperature sensor 130. The heater 100 is controlled on the basis of the difference in temperatures measured by the first and second temperature sensors 120, 130. This can be seen as feed-forward control.

The above described fluid temperature control method relies on the first and second temperature sensors 120, 130 achieving the substantially same readings for a given temperature of fluid or being calibrated relative to one another (for example by calculating a calibration temperature error in the second temperature sensor relative to the first temperature sensor or vice versa). The absolute accuracy of the temperature sensors 120, 130 is not that important.

The fluid temperature control unit of FIG. 6 is adapted to allow a calculation unit 150c which may or may not be part of the controller 150, to calculate a calibration temperature error in the second temperature sensor 130 relative to the first temperature sensor 120, or vice versa. This is achieved by preventing flow of second fluid through the heat exchanger 170 under the control of controller 150 at a calibration time. This is achieved by providing in the second fluid path 140 a second by-pass loop 190 which by-passes the heat exchanger 170 and one-way valve 145 (which is downstream or upstream of the heat exchanger 170).

A valve 180 is provided which can switch flow of second fluid from the inlet 141 through the heat exchanger 170 or through the second by-pass loop 190. One-way valve 145 prevents second fluid from flowing from the end of the second by-pass loop 190 to the heat exchanger 170. Therefore, second fluid flows from the second by-pass loop 190 towards the outlet 142.

The second by-pass loop 190 is provided with a flow restrictor 195. The flow restrictor 195 is designed so that the second by-pass loop 190 has a flow resistance which is substantially equal to the flow resistance of the path through the heat exchanger 170 and one-way valve 145. In this way whether the valve 180 is directing flow through the heat exchanger 170 or through the second by-pass loop 190 will have little effect on the second fluid temperature or its pressure drop so that operation of the projection system cooling system is not affected.

When the controller 150 has prevented flow of second fluid through heat exchanger 170, a calibration time can be started. After a certain amount of time (e.g. a predetermined amount of time determined on the basis of experience, for example) the temperature of first fluid exiting the heat exchanger 170 will be substantially equal to the temperature of first fluid entering the heat exchanger. Thereby the temperature of first fluid at the second temperature sensor 130 will be substantially equal to the temperature of first fluid passing the junction of the first fluid path 110 with the first by-pass loop 160. If the heater 100 is turned off, the temperature of first fluid at the first temperature sensor 120 should have the substantially same temperature as the first fluid at the second temperature sensor 130. Therefore, the calibration unit 150c can compare the signals from the first temperature sensor and second temperature sensor 120, 130 and assume that they are measuring fluid of the substantially same temperature. On the basis of those two signals, and the difference between them, a calibration temperature error can be calculated.

The calibration temperature error calculated by the calculation unit 150c can be used by the controller 150 during normal operation. This helps ensure that any offset between the temperatures measured by the first and second temperature sensors 120, 130 can be accounted for. In that way the actual temperature of the first fluid leaving outlet 112 is substantially equal to the temperature of the second fluid irrespective of any drift between the first and second temperature sensors 120, 130.

In an embodiment the temperature sensors are desirably negative temperature coefficient (NTC) sensors. Such sensors desirably have an accuracy of at least as good as +/−1 mK. More desirably still, the sensor has an accuracy of at least as good as +/−0.1 mK.

Desirably the temperature of first fluid at the outlet side of the coarse temperature controller 90 is within the working range of heater 100, e.g. 10 mK lower than the temperature of the second fluid. This is because the power consumption of the heater 100 is desirably as small as possible so that the thermal stability of the unit is not disturbed.

To make the calibration as accurate as possible, the distance between the first and second temperature sensors 120, 130 is desirably as small as possible. Furthermore, it is desirable to thermally insulate the conduits of the first fluid path 110 and first by-pass loop 160. Additionally, the temperature of the environment (for example the environment enclosed by rectangle 198) should be kept as stable as possible. The reason for this is that the paths followed by the first fluid which flows through the first by-pass loop 160 and the first fluid path 110 are different and therefore they pick up different amounts of heat from the environment. This can translate into an extra off-set present even after calibration. For example, it may be necessary to thermally isolate all electrical heat generating components (e.g. the liquid flow controller 95, heater 100 and maybe even valve 180) from the first fluid path downstream of the junction with the first by-pass loop 160 to the first temperature sensor 120 and the first by-pass loop 160.

This system has an advantage that physically removing the sensor from the apparatus is no longer necessary and human errors are excluded. Furthermore, there is no downtime of the machine for calibration. The chance of contamination of the immersion liquid supply system is avoided because it is not necessary to open that supply system in order to perform calibration. Furthermore, if one temperature sensor needs replacing, only that temperature sensor needs to be replaced and the calibration procedure carried out. This is advantageous from a cost point of view as well as a downtime point of view.

During calibration the pressure of the first liquid is unchanged. Therefore no liquid need be wasted during calibration. Indeed, it may be possible to perform this procedure during exposure, depending on the stability of the second fluid flow used for cooling the projection system. Neither first fluid or second fluid is wasted by directing it to a drain.

FIG. 7 illustrates a further embodiment. The further embodiment of FIG. 7 is the same as that of FIG. 6 except as described below.

In the FIG. 7 embodiment the principle of operation is to adjust the temperature of the first fluid using a heater 100, first sensor 120 and second sensor 130 (which directly measures the temperature of the second fluid) so that the temperature of the first fluid is adjusted to be the substantially same as the temperature of the second fluid.

There may be provided a coarse temperature controller 90 and liquid flow controller 95 as in the embodiment of FIG. 6.

Downstream of the heater 100 and first sensor 120 a branch line 220 branches off the first flow path 110. The branch line 220 leads to a first sub-branch line 240 with a valve 227 for controlling flow through the first sub-branch line 240. The first sub-branch line 240 includes a flow restrictor 225 to restrict the amount of flow. Flow of first fluid is directed through the first flow path 110 and the first sub-branch line 240 during normal operation. A second sub-branch line 250 leads from the branch line 220 to a conduit portion 260 in which the second temperature sensor 130 is provided via valve 230. The second sub-branch line 250 directs flow to the drain 248 after the conduit portion 260.

Valves 227, 230, 233 are provided and controlled by controller 150 to switch the first fluid flow through either the first sub-branch line 240 (during normal operation) or through the second sub-branch line 250 (during a calibration time). The flow restrictor 225 restricts the flow through the first sub-branch line 240 by an amount equal to the flow restriction in the second sub-branch line 250. Thus, when switching to calibration mode there is no change in pressure in the first flow path 110. Additionally there is continuous flow through branch line 220 thereby reducing the chance of bacteria growing in the branch lines 220, 240, 250 and finding their way into the first flow path 110. Thus, first fluid can pass through the conduit portion 260 and have its temperature sensed by the second temperature sensor 130 during calibration time. In this way, as with the embodiment of FIG. 6, if the heater 100 is deactivated, the temperature of the first fluid measured by the first and second temperature sensors 120, 130 is substantially the same. Therefore the calibration unit 150c can calibrate the two sensors relative to one another, as in the embodiment of FIG. 6.

In the embodiment of FIG. 7, during normal operation, valves 270, 272 in second fluid path 140 under control of the controller 150 are set for flow of second fluid to the conduit portion 260. During the calibration time, valves 270, 272 under control of controller 150 are shut so that second fluid does not flow in the conduit portion 260. Second fluid will continue to flow in the second fluid path 140 through a portion 280 which includes a flow restriction 290, during calibration time. Flow will pass through portion 280 during normal operation too.

Figure 8:
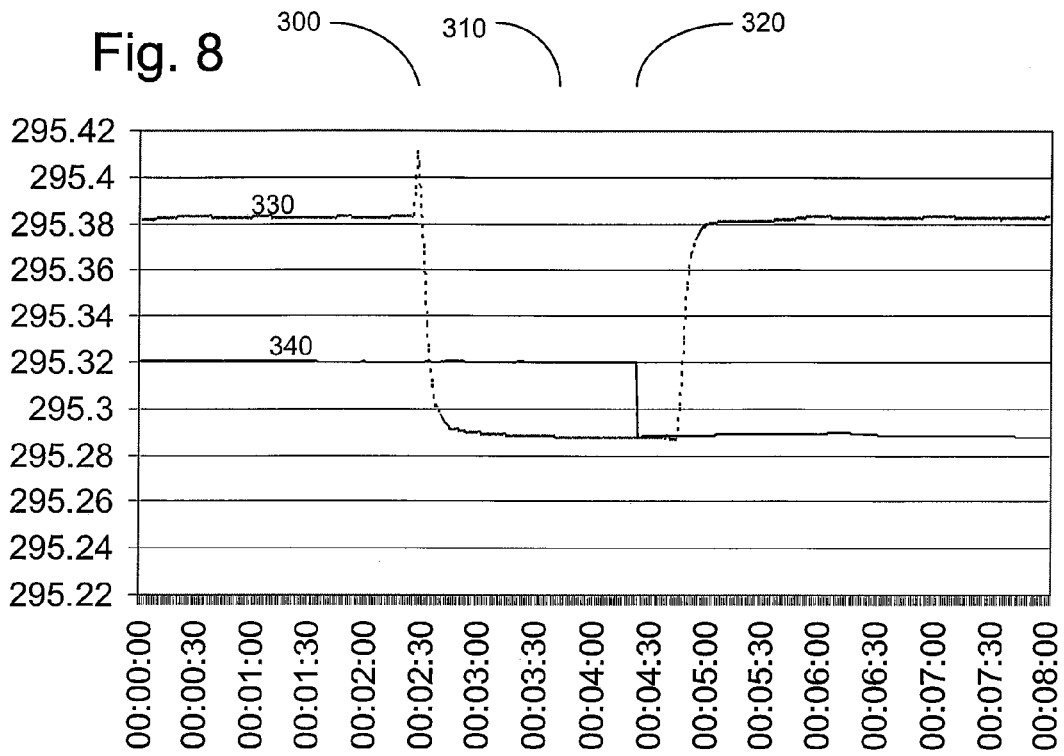
FIG. 8 depicts a graph showing example temperatures of two temperature sensors of the fluid temperature control unit of FIG. 7.
Figure 9:
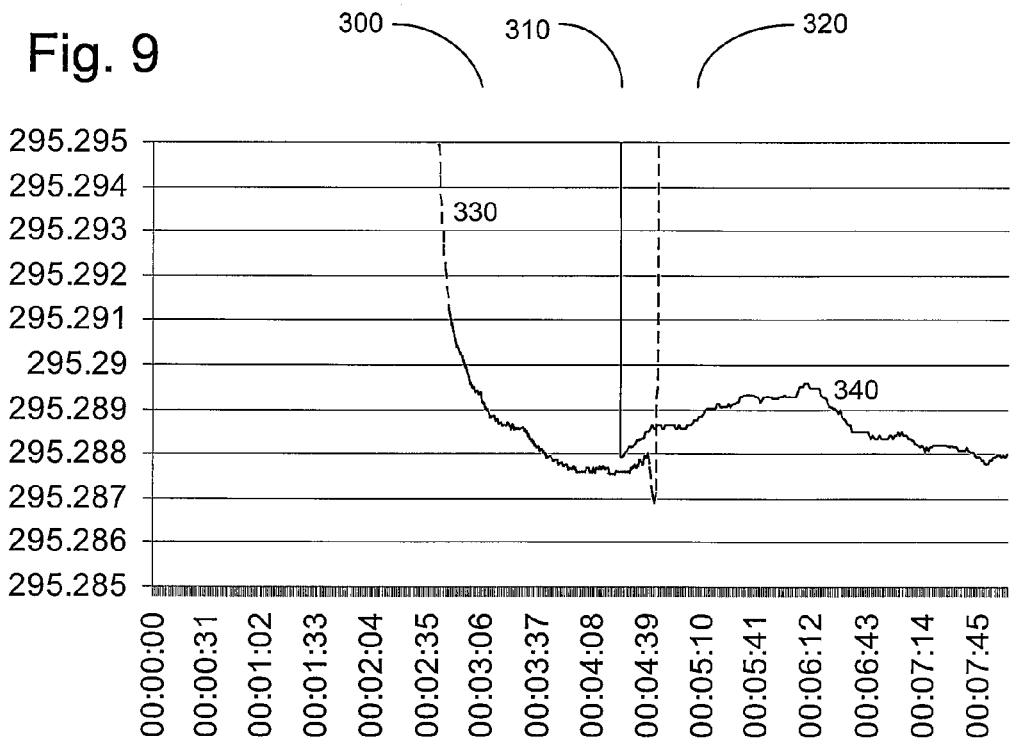
FIG. 9 is a detail of the graph of FIG. 8.

FIGS. 8 and 9 illustrate example temperatures measured by the first sensor 120 (indicated by line 340) and the temperature measured by the second sensor 130 (indicated by line 330) varying with time for the FIG. 7 embodiment. From time 0 to about 2.25, normal operation is occurring. A temperature calibration offset of 60 mK is applied to the measurement of the first sensor 120 compared to the second sensor 130 as this is the offset previously measured. Thus the temperature of the first and second liquids are substantially equal.

At about time 2.25, at position 300, the valves are adjusted so that the first fluid is directed over the second temperature sensor 130. As can be seen, it takes time for the temperatures measured by the second temperature sensor 130 to reach equilibrium. This could be, for example, because liquid has been sitting in the conduits between the first flow path 110 and the second temperature sensor 130 and has heated up. Therefore no calibration is done for a certain time. In the embodiment illustrated in FIG. 8, the certain time was 2.3 minutes and as can be seen in FIG. 9 after this time the temperature reading of the second temperature sensor 130 as indicated by line 330 has substantially reached steady state. At this time (position 310) the new temperature calibration offset error can be calculated. This is the old temperature calibration offset (of 60 mK) plus the difference in temperature measured between the first temperature sensor 120 as indicated by line 340 and the temperature of the first fluid measured by the second temperature sensor 130 as indicated by line 330. In the example of FIG. 8 this is about 30 mK. Therefore a new calibration temperature error of 90 mK is calculated.

After the valves are returned to their normal use position and second fluid rather than first fluid flows over the second temperature sensor 130 (at point 320), the new calibration temperature offset is applied to the first temperature sensor 120. It can be seen that the temperature of the first fluid can be aligned with the temperature of the second fluid because of Me known 90 mK offset between the readings of the first and second temperature sensors 120, 130.

As can be seen at time 310 in FIG. 9, after the calibration temperature error has been applied and before the valves are switched back to normal mode, the temperature measured by the first temperature sensor 120 is only 0.5 mK different to the temperature of the same first fluid measured by the second temperature sensor 130. This indicates that an accuracy of 0.5 mK can be achieved using an embodiment of the present invention.

As will be appreciated, any of the above described features can be used with any other feature and it is not only those combinations explicitly described which are covered in this application.

In an aspect, there is provided a fluid temperature control unit comprising: a heater configured to heat a first fluid in a first fluid path; a first temperature sensor configured to measure a temperature of the first fluid in the first fluid path; a second temperature sensor configured to measure a temperature of a second fluid in a second fluid path; and a controller configured to control the heater on the basis of the temperature sensed by the first sensor and the temperature sensed by the second sensor. Desirably the controller is configured to control the heater on the basis of a difference between the temperature sensed by the first sensor and the temperature sensed by the second sensor. Desirably the first temperature sensor is downstream of the heater. Desirably the second temperature sensor is in a first by-pass loop of the first fluid path. Desirably a heat exchanger is provided upstream of the second temperature sensor in the first by-pass loop, wherein the heat exchanger is configured to exchange heat between second fluid in the second fluid path and first fluid in the first by-pass loop such that the first fluid in the first by-pass loop reaches the temperature of the second fluid in the second fluid path so that by measuring the temperature of first fluid downstream of the heat exchanger the second temperature sensor measures the temperature of the second fluid in the second fluid path. Desirably a flow restrictor is provided in the first by-pass loop to restrict flow in the first by-pass loop. Desirably the controller is configured to cause prevention of flow of second fluid to the heat exchanger during a calibration time. Desirably a calculation unit configured to calculate a calibration temperature error in the second temperature sensor relative to the first temperature sensor, or vice versa, during the calibration time is provided. Desirably a valve is provided to selectively switch flow to the heat exchanger or to a second by-pass loop of the second fluid path which by-passes the heat exchanger. Desirably the valve is a slow valve. Desirably the second by-pass loop comprises a flow restrictor configured to restrict flow substantially the same amount as the path through the heat exchanger. Desirably the first by-pass loop is upstream of the heater. Desirably a branch from the first fluid path upstream of the first temperature sensor is provided. Desirably the branch comprises a valve to switch between a first sub-branch and a second sub-branch, desirably wherein the first sub-branch and second sub-branch have substantially the same flow restriction. Desirably the second sub-branch comprises a conduit portion which includes the second temperature sensor. Desirably a valve in the second fluid path is switchable so that second fluid flows in the conduit portion. Desirably the controller is configured to control valves of the fluid temperature control unit such that during normal use only second fluid flows in the conduit portion and during a calibration time only first fluid flows in the conduit portion. Desirably a calculation unit configured to calculate a calibration temperature error in the second temperature sensor relative to the first temperature sensor, or vice versa, during the calibration time is provided.

In a further aspect there is provided an immersion lithographic apparatus comprising a projection system and the fluid temperature control unit of the above aspect. Desirably the first fluid path is a fluid path for immersion liquid to be provided in a space between the projection system and a substrate. Desirably the second fluid path is a fluid path for liquid for thermal conditioning of the projection system.

In a further aspect, there is provided a temperature sensor calibration unit comprising: a first temperature sensor configured to measure a temperature of a first fluid in a first fluid path; a second temperature sensor in a conduit portion; a valve configured to selectively switch flow of first fluid from the first fluid path to the conduit portion or flow of a second fluid from a second fluid path to the conduit portion; and a calculation unit configured to calculate a calibration temperature error in the second temperature sensor relative to the first temperature sensor, or vice versa, when the valve has switched flow of first fluid from the first fluid path to the conduit portion. Desirably a controller configured to control the valve to switch flow of the first fluid from the first fluid path to the conduit portion at a calibration time is provided.

In a further aspect, there is provided a fluid temperature measurement unit comprising: a first temperature sensor configured to measure a temperature of a first fluid in a first fluid path; a second temperature sensor configured to measure a temperature of the first fluid in a by-pass loop of the first fluid path; and a heat exchanger in the by-pass loop upstream of the second temperature sensor to exchange heat between first fluid in the by-pass loop and a second fluid. Desirably a controller configured to cause prevention of flow of second fluid into the heat exchanger at a calibration time and/or to control fluid flow so that the first fluid has its temperature controlled to the temperature of the second fluid during a working time is provided. Desirably a calculation unit configured to calculate a calibration temperature error in the second temperature sensor relative to the first temperature sensor, or vice versa, during the calibration time is provided. Desirably a heater configured to heat the first fluid in the first fluid path upstream of the first temperature sensor is provided. Desirably the or a controller is configured to control the heater on the basis of temperatures measured by the first and second temperature sensors so that downstream of the heater the first fluid has a temperature substantially equal to that of the second fluid.

In a further aspect, there is provided a method of controlling a temperature of a fluid at a fluid outlet of a first fluid path, the method comprising: measuring the temperature of a first fluid in the first fluid path downstream of a heater in the first fluid path; measuring a temperature of a second fluid in a second fluid path; and controlling the heater on the basis of the temperature of the first fluid and the second fluid so that the heater heats the first fluid to bring its temperature closer to that of the second fluid.

In a further aspect, there is provided a method of sensor calibration, the method comprising: measuring a temperature of a first fluid in a first fluid path using a first temperature sensor; measuring a temperature of fluid in a conduit portion using a second temperature sensor; switching flow of first fluid from the first fluid path to the conduit portion; and calculating a calibration temperature error in the second temperature sensor relative to the first temperature sensor, or vice versa, on the basis of signals from the first and second temperature sensors.

In a further aspect, there is provided a method of measuring a temperature in a second fluid, the method comprising: placing a temperature sensor in a by-pass loop of a first fluid path; and providing a heat exchanger in the by-pass loop upstream of the temperature sensor for exchanging heat between first fluid in the by-pass loop and the second fluid In a further aspect, there is provided a device manufacturing method comprising projecting a patterned beam of radiation onto a substrate through a liquid and further comprising the method of any of the above aspects wherein the liquid is the first fluid.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid temperature control unit comprising:
a heater configured to heat a first fluid in a first fluid path;
a first temperature sensor configured to measure a temperature of the first fluid in the first fluid path;
a second temperature sensor configured to measure a temperature of a second fluid in a second fluid path; and
a controller configured to control the heater on the basis of the temperature sensed by the first sensor and the temperature sensed by the second sensor.

2. The fluid temperature control unit of claim 1, wherein the controller is configured to control the heater on the basis of a difference between the temperature sensed by the first sensor and the temperature sensed by the second sensor.

3. The fluid temperature control unit of claim 1, wherein the first temperature sensor is downstream of the heater.

4. The fluid temperature control unit of claim 1, wherein the second temperature sensor is in a first by-pass loop of the first fluid path.

5. The fluid temperature control unit of claim 4, further comprising a heat exchanger upstream of the second temperature sensor in the first by-pass loop, wherein the heat exchanger is configured to exchange heat between second fluid in the second fluid path and first fluid in the first by-pass loop such that the first fluid in the first by-pass loop reaches the substantially same temperature as that of the second fluid in the second fluid path so that by measuring the temperature of first fluid downstream of the heat exchanger the second temperature sensor measures the temperature of the second fluid in the second fluid path.

6. The fluid temperature control unit of claim 4, further comprising a flow restrictor in the first by-pass loop to restrict flow in the first by-pass loop.

7. The fluid temperature control unit of claim 4, wherein the controller is configured to cause prevention of flow of second fluid to the heat exchanger during a calibration time.

8. The fluid temperature control unit of claim 7, further comprising a calculation unit configured to calculate a calibration temperature error in the second temperature sensor relative to the first temperature sensor, or vice versa, during the calibration time.

9. The fluid temperature control unit of claim 7, further comprising a valve configured to selectively switch flow to the heat exchanger or to a second by-pass loop of the second fluid path which by-passes the heat exchanger.

10. The fluid temperature control unit of claim 9, wherein the valve is a slow valve.

11. The fluid temperature control unit of claim 9, wherein the second by-pass loop comprises a flow restrictor configured to restrict flow substantially the same amount as the path through the heat exchanger.

12. The fluid temperature control unit of claim 4, wherein the first by-pass loop is upstream of the heater.

13. The fluid temperature control unit of claim 1, further comprising a branch from the first fluid path downstream of the first temperature sensor.

14. The fluid temperature control unit of claim 13, wherein the branch comprises a valve to switch between a first sub-branch and a second sub-branch.

15. The fluid temperature control unit of claim 14, wherein the second sub-branch comprises a conduit portion which includes the second temperature sensor.

16. The fluid temperature control unit of claim 15, wherein a valve in the second fluid path is switchable so that second fluid flows in the conduit portion.

17. The fluid temperature control unit of claim 15, wherein the controller is configured to control valves of the fluid temperature control unit such that during normal use only second fluid flows in the conduit portion and during a calibration time only first fluid flows in the conduit portion.

18. The fluid temperature control unit of claim 17, further comprising a calculation unit configured to calculate a calibration temperature error in the second temperature sensor relative to the first temperature sensor, or vice versa, during the calibration time.

19. A fluid temperature measurement unit comprising:
a first temperature sensor configured to measure a temperature of a first fluid in a first fluid path;

a second temperature sensor configured to measure a temperature of the first fluid in a by-pass loop of the first fluid path; and a heat exchanger in the by-pass loop upstream of the second temperature sensor to exchange heat between first fluid in the by-pass loop and a second fluid.

20. The fluid temperature measurement unit of claim 19, further comprising a controller configured to cause prevention of flow of second fluid into the heat exchanger at a calibration time and/or to control fluid flow so that the first fluid has its temperature controlled to the temperature of the second fluid during a working time.

21. The fluid temperature measurement unit of claim 20, further comprising a calculation unit configured to calculate a calibration temperature error in the second temperature sensor relative to the first temperature sensor, or vice versa, during the calibration time.

22. The fluid temperature measurement unit of claim 19, further comprising a heater configured to heat the first fluid in the first fluid path upstream of the first temperature sensor.

23. The fluid temperature measurement unit of claim 22, wherein a controller is configured to control the heater on the basis of temperatures measured by the first and second temperature sensors so that downstream of the heater the first fluid has a temperature substantially equal to that of the second fluid.

24. The fluid temperature control unit of claim 14, wherein the first sub-branch and second sub-branch have substantially the same flow restriction.

* * * * *